United States Patent
Steinbach

(10) Patent No.: US 6,459,400 B1
(45) Date of Patent: Oct. 1, 2002

(54) APPARATUS FOR HIGH SPEED ANALOG-TO-DIGITAL CONVERSION BY LOCALIZING AN INPUT VOLTAGE TO A VOLTAGE RANGE

(75) Inventor: Günter W. Steinbach, Palo Alto, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/728,291

(22) Filed: Dec. 1, 2000

(51) Int. Cl.$^7$ ................................................. H03M 1/12
(52) U.S. Cl. ........................ 341/156; 341/155; 341/118
(58) Field of Search ................................ 341/156, 159, 341/158, 155, 118

(56) References Cited

U.S. PATENT DOCUMENTS

| | | | | |
|---|---|---|---|---|
| 5,126,742 A | * | 6/1992 | Schmidt et al. | 341/156 |
| 5,247,301 A | * | 9/1993 | Yahagi et al. | 341/118 |
| 5,400,029 A | * | 3/1995 | Kobayashi | 341/156 |
| 5,444,447 A | * | 8/1995 | Wingender | 341/156 |
| 5,471,210 A | * | 11/1995 | Wingender et al. | 341/156 |
| 5,675,340 A | * | 10/1997 | Hester et al. | 341/118 |
| 5,689,260 A | * | 11/1997 | Vallancourt | 341/156 |
| 5,973,632 A | * | 10/1999 | Tai | 341/155 |
| 6,100,834 A | * | 8/2000 | Lewyn | 341/155 |

OTHER PUBLICATIONS

Siek, L. and Do, M.A., "Top–Down Approach in High Speed ADC," Aurora '98, San Jose, California, Mar. 16–17, 1998.

\* cited by examiner

Primary Examiner—Michael Tokar
Assistant Examiner—Lam T. Mai
(74) Attorney, Agent, or Firm—Stephen Bongini; Lisa K. Jorgenson

(57) ABSTRACT

An analog-to-digital converter (500) for sampling high speed video signals includes a first input (502) for receiving an electronic signal, a sampling clock input (547) for receiving a sampling clock signal, and first and second sampling circuits. The first sampling circuit is arranged in a differential circuit arrangement, and is electrically connected to the first input (502) and to the sampling clock input (547) and is responsive to the sampling clock signal, for sampling the electronic signal to provide a pair of boundary reference voltage signals (706, 708, 710, 712) that bound the voltage of the sampled electronic signal, and further to convert the sampled electronic signal to provide the most significant bits (554) of a digital representation of the electronic signal at times indicated by the sampling clock signal. The second sampling circuit is arranged in a differential circuit arrangement, and includes an interpolation circuit (560) electrically connected to the first sampling circuit, for sampling an interpolated signal corresponding to the pair of boundary reference voltage signals (706, 708, 710, 712), and further to convert the sampled interpolated signal to provide the least significant bits (588) of the digital representation of the sampled electronic signal at times indicated by the sampling clock signal. A video display monitor system (800) includes analog-to-digital converters (812).

29 Claims, 7 Drawing Sheets

APPARATUS FOR HIGH SPEED ANALOG-TO-DIGITAL CONVERSION BY LOCALIZING AN INPUT VOLTAGE TO A VOLTAGE RANGE

BACKGROUND OF THE INVENTION

1. Field of the Invention

This invention relates in general to analog-to-digital converter systems, and more particularly to a high speed analog-to-digital converter suitable for processing video signals.

2. Description of Related Art

A variety of electronic devices, such as computers, monitors, flat panel displays, wireless communication devices, to name just a few, utilize high speed electronic signals, e.g., clock signals, video signals, spread spectrum and digital wireless communication signals, etc. A predominant trend in electronic devices is the use of digital signals. As is well known to those of ordinary skill in the art, there are many advantages to representing electronic signals in digital signal form in many such electronic devices.

An analog-to-digital converter (ADC) is typically utilized to sample an analog electronic signal at a point in time and to convert the sampled electronic signal to a digital representation thereof. The ADC, in one common configuration, typically includes a resistive ladder network electrically coupled to a plurality of comparators that are respectively referenced to a plurality of reference voltages provided by said resistive network. The ADC compares the voltage amplitude of an input signal to the plurality of reference voltages and provides an output signal that is a digital representation of the input signal at a point in time.

Regrettably, conventional ADC implementations have been typically designed for electronic signaling that is much slower than needed for handling the higher speed of video signaling. For high speed signaling applications, such as video signaling, ADCs have unique requirements that in the past have not been met by conventional ADC technology.

First, referring to FIG. 1, ADCs typically sample an input signal 102 utilizing an input network of resistors in a resistor ladder 104 coupled to comparators 110 comparing each progressive step in the ladder 108 to a different reference voltage value. Each comparator 110, therefore, provides a progressive detection step in determining a digital representation of an input signal 102. Since there is a continuous need for higher precision in the final digital representation that is output from the ADC that is sampling an analog signal, every additional bit line typically multiplies the number of comparators by at least a factor of 2. This in turn increases the expense and complexity of the ADC circuits. Secondly, besides the added expense of the more complex integrated circuits, the increased number of circuit elements additionally increases the opportunities for circuit failures and hence detrimentally impacts overall quality of the ADC as perceived by customers. Thirdly, the higher number of comparators necessary for higher resolution increases the power consumption of the ADC circuits thereby decreasing the potential speed of driving these circuits at a given power budget. For very high speed circuits it is imperative to drive the ADC at a maximum speed to track the very high speed signals such as in video signaling. Therefore, for a given power budget and for maximum speed for an ADC it is critical to keep the comparator count low.

Additionally, there is a significant need to provide enhanced resolution at the output of modern ADCs. The higher resolution requirement has called for higher numbers of comparators and related circuit elements. This tends to increase the cost of the ADC. At the same time, the cost of such ADCs must be kept as low as possible for commercial viability. Competitive pressures in many markets, especially for high volume products, require that component costs, such as for a high speed ADC, be kept very low. Therefore, there are seriously opposing technical design constraints for providing a high resolution ADC while keeping the cost low.

To increase the resolution of a digital output signal, prior art designs have added interpolation stages on the output side of an ADC. For example, as shown in FIG. 1, the output of the comparators 110 normally would couple directly to output capture latches 130. However, interpolated output latches 140 and a second ladder 120, arranged as shown, can be added to the output side of an ADC to increase (in the example shown in FIG. 1, multiply by 4) the total number of outputs 124. As can be seen, although the number of output lines can be significantly increased, the resolution steps for sampling the input signal 102 are still limited to the number of comparators and associated capture latches 130. Specifically, an interpolating ADC has a number of input stages and then has a structure, typically a resistor string and/or capacitors, that interpolates between output voltages of adjacent input stages to provide additional output stages that allow making more decisions about signal granularity than there are input stages. For example, an ADC may have 16 input stages and be designed for four time interpolation or 64 output stages. For each input stage there are four output stages and an interpolating structure spans all the array of input stages to interpolate the output voltage across all the 64 output stages. This allows finer granularity at the output signal.

An alternative design in the prior art, as illustrated in FIG. 2, utilized a "coarse measurement" ADC 202, a "fine measurement" ADC 218, a digital to analog converter (DAC) 212, a subtraction stage 214, and an amplifier stage 216, to provide a sub-ranging approach to convert an analog input signal 204 to a digital output signal 210, 222. Note that the "coarse measurement" output 210 provides the most significant bits (upper range of digital signal output) and the "fine measurement" output 222 provides the least significant bits (lower range of digital signal output) of the digital output signal 210, 222. Also, note that the "coarse measurement" ADC 202 operates relative to a first reference voltage 206, 208, while the "fine measurement" ADC 218 operates relative to a second reference voltage 220. Although each ADC may utilize a lower number of comparator steps, the overall ADC circuit 200 does require the added components of the DAC 212, the subtraction stage 214, and the amplifier stage 216. This sub-ranging approach, unfortunately, adds overall circuit complexity and the additional DAC stage adds timing delay to the overall analog to digital conversion process which may tend to reduce the sampling speed of the overall ADC circuit 200. This added timing delay reduces the maximum speed that a high speed ADC can sample analog signals, which conflicts with the requirement for a high speed ADC to sample very high speed signals such as video signals.

Thus, there is a need to overcome the disadvantages of the prior art, such as discussed above, and in particular to improve the resolution and speed of conversion of the analog electronic signal to a digital representation thereof while operating within a power consumption constraint and while keeping product cost low.

DETAILED DESCRIPTION OF THE PREFERRED EMBODIMENTS

An analog to digital converter (ADC), according to a preferred embodiment of the present invention, can initially determine that an input voltage is between the reference voltages of two input stages (a voltage range). Each input stage is typically characterized by a comparator that detects whether an input voltage has met a reference voltage threshold. Then, according to the preferred embodiment of the present invention, the ADC interpolates using output stages associated with those two input stages. This has the significant advantage of very high speed operation while maintaining a very low overall circuit count. By reducing the number of input stages this also has the advantage of reducing the signal loading on an ADC circuit and enhancing the performance of the ADC.

The present invention recognizes that for any given input signal voltage there is one stage that makes the critical decision of where is the input signal voltage in a predefined voltage range to provide a digital representation of the input voltage. An ADC, according to a preferred embodiment of the present invention, can initially determine that the input voltage is between the reference voltages of two input stages (a voltage range). Then, the ADC only interpolates using the output stages associated with those two input stages. The remaining output stages, and their associated interpolation circuitry, can be ignored. Ideally, by localizing the input voltage to a range between two input stages the additional circuitry of the other output stages and interpolating structure can be totally avoided in a design and thereby saving a significant amount of components, saving power dissipation because redundant output stages would have to be powered all the time for high speed performance, and consequently increasing the power budget for higher speed operation of the ADC circuits.

Figure 1:
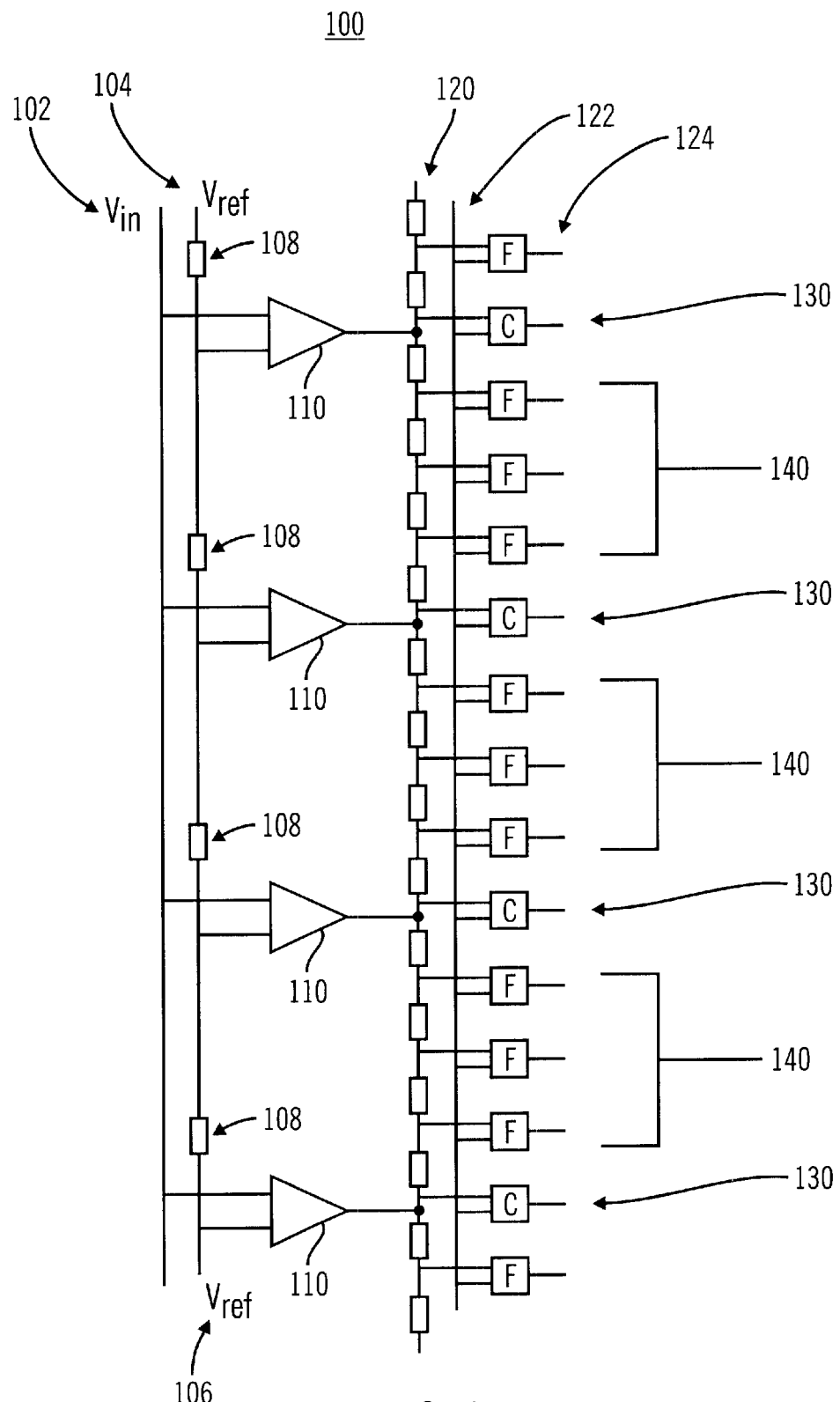
FIGS. 1 and 2 are electrical circuit block diagrams illustrating exemplary prior art analog-to-digital converter implementations.
Figure 2:
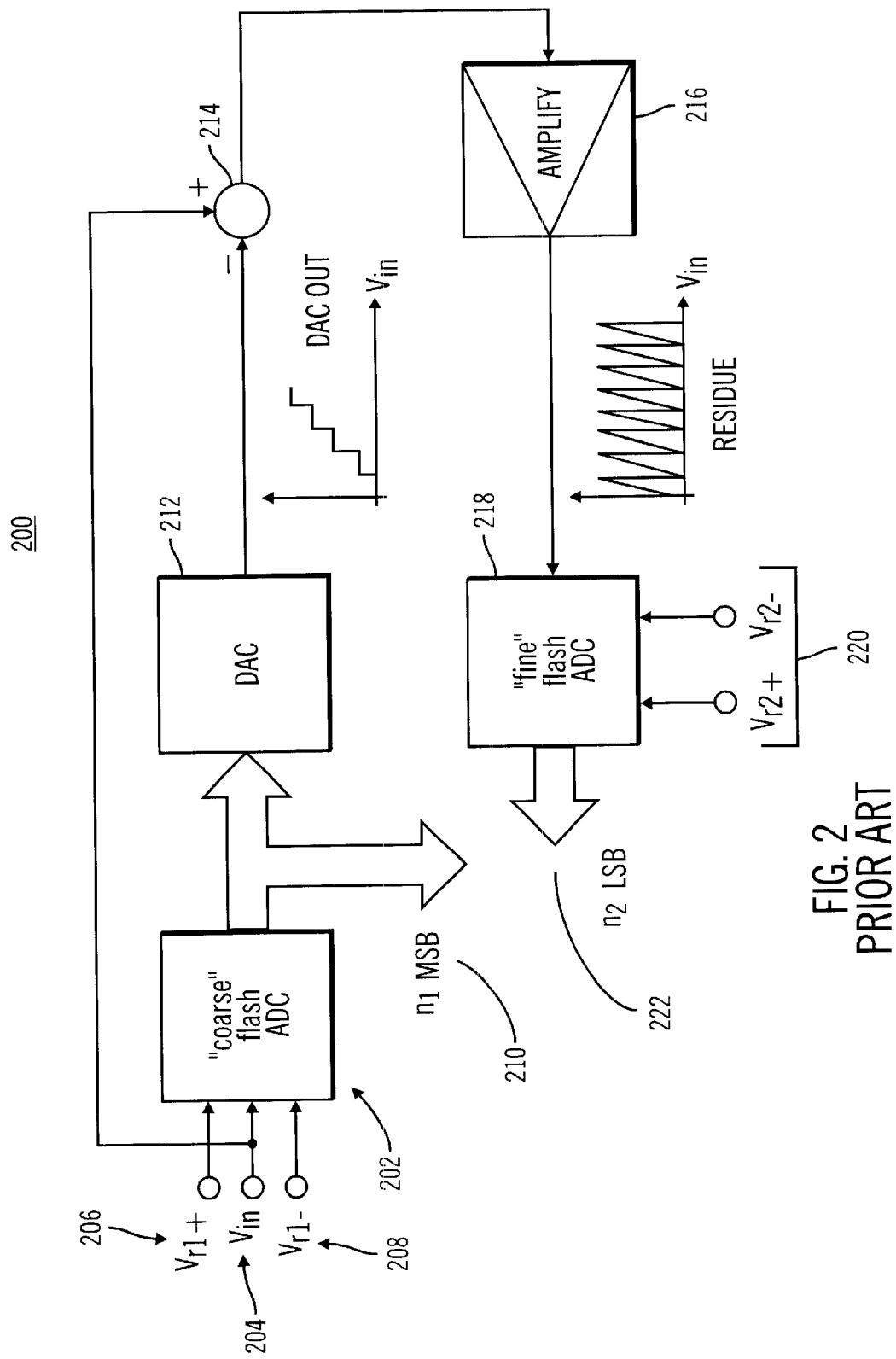

According to a preferred embodiment of the present invention, a sense circuit senses what specific pair of input stages are handling the crucial transition for sensing the input voltage and then only the interpolation about those two input stages is valid and the remaining output stages and interpolation structure are not needed. For example, instead of having all 64 output stages as shown in FIG. 1, with associated interpolating structure, an ADC can have only 4 output stages that are mapped to a pair of input stages that are determined to cover a range for the input voltage. The present invention couples the predefined four output stages to a pair of input stages that are utilized for sensing the range of the input voltage, as will be discussed in more detail below.

Figure 3:
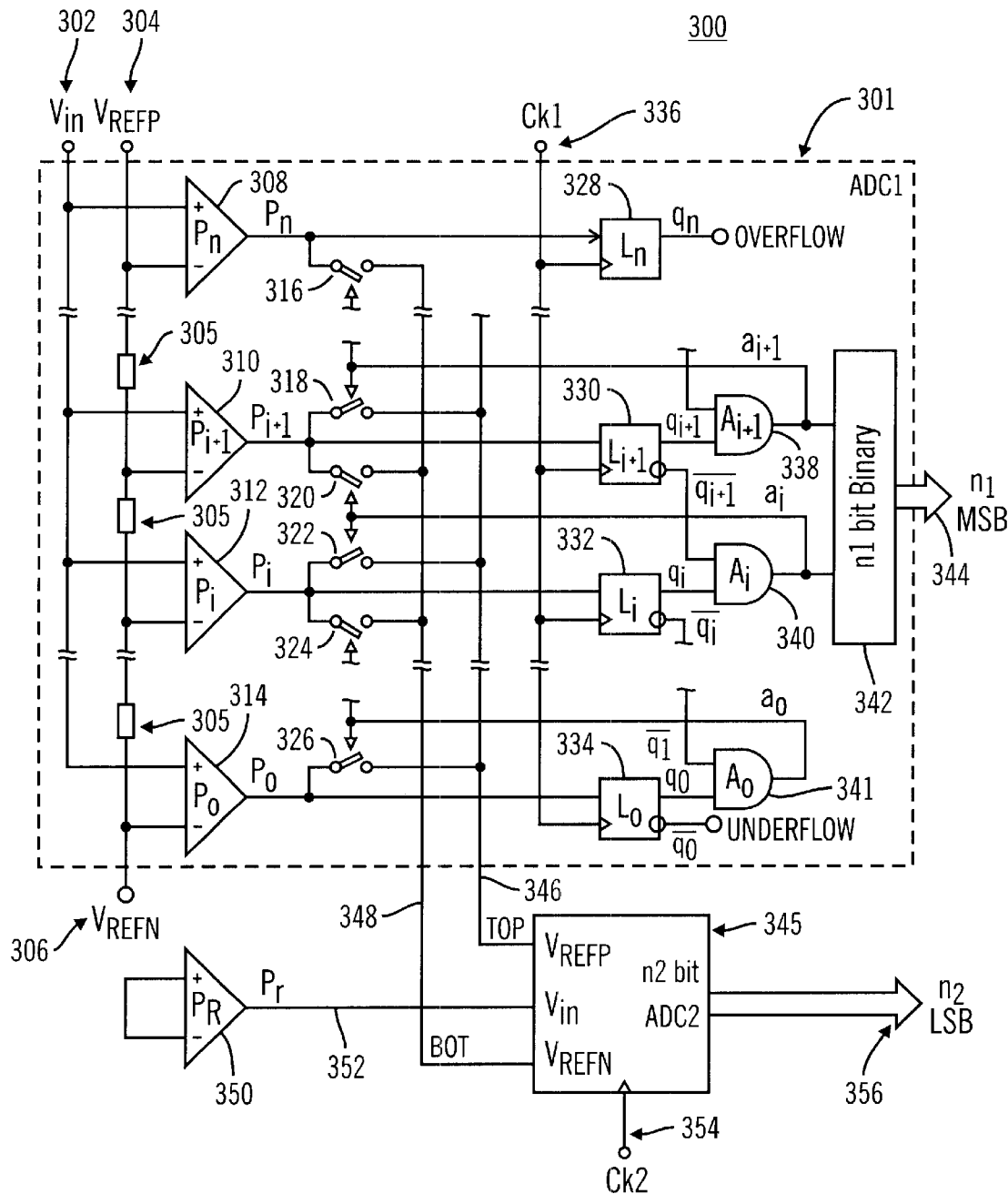
FIG. 3 is an electrical circuit block diagram showing an exemplary analog-to-digital converter, in accordance with a preferred embodiment of the present invention.

Referring to FIG. 3, according to a preferred embodiment of the present invention, an ADC 300 provides a digital representation 344, 356, of an analog voltage signal at an input 302. The ADC 300 comprises a course ADC 301 and a fine ADC 345. The course ADC 301 provides the most significant bits (MSB) 344 of a digital representation and the fine ADC 345 provides the least significant bits (LSB) 356 of a digital representation. An input 302 receives an analog voltage input signal that is to be digitized by the ADC 300. A set of internal reference voltages is provided between a positive external reference voltage input 304 and a negative external reference voltage input 306.

A more detailed discussion of the ADC 300 will now turn to a discussion of the coarse ADC 301, in accordance with a preferred embodiment of the present invention. The reference voltage is applied to a resistor ladder 305 in the course ADC 301. A plurality of input stages comprise pre-amplifying comparators Pn 308, Pi+1 310 to Pi 312, and Po 314. The output of the comparators Pn 308, Pi+1 310 to Pi 312, and Po 314, are electrically coupled to respective switches 316, 318, 320, 322, 324, 326, as shown, and also are electrically coupled to latches 328, 330, 332, 334, as shown. The output of the latches 328, 330, 332, 334, are electrically coupled to AND gates 338, 340, 341, as shown, and operate to make a digital decision. When an input voltage 302 is within a reference voltage range indicated by the output of one or more of the pre-amplifying comparators Pn 308, Pi+1 310 to Pi 312, and Po 314, the outputs of the AND gates indicate a voltage range. Specifically, at any point in time, only one AND gate output is high and the output of all other AND gates are low. This high output indicates the AND gate that is associated with the lower reference voltage of a voltage range. The low output of the AND gate associated with the next higher reference voltage indicates the upper reference voltage of the range. The range is defined by the lower and upper reference voltages as discussed above. Additionally, the output of all the AND gates are electrically coupled to a binary encoder 342. The output of the binary encoder 342 provides the most significant bits 344 of a digital representation of the analog input signal at the input 302.

As discussed above, the high output of an AND gate, such as AND gate Ai 340, indicates the lower reference voltage of a voltage range. This is the critical junction defining the voltage range. In this example, the high output of the AND gate Ai 340 turns on the switches that route the pre-amplifying comparators Pi 312 and Pi+1 310 to power bus lines TOP 346 and BOT 348. These power bus lines provide a reference voltage range to the voltage reference inputs of a second ADC 345. Note also that the first ADC 301 is clocked via first clock input 336 while the second ADC 345 is clocked via second clock input 354. The clock signals into the first and second clock inputs 336, 354, are not necessarily identical. The second ADC 345 is an interpolating ADC and provides the fine resolution for the least significant bits 356 of an output digital representation of an input voltage signal at the input 302.

The second ADC 345 contains a resistor ladder (not shown) that interpolates between the two reference voltages that are provided at TOP and BOT outputs 346, 348, of the first ADC 301. The pre-amplifying comparators Pn 308, Pi+1 310 to Pi 312, and Po 314 have analog outputs in the linear range of the pre-amplifying comparators Pn 308, Pi+1 310 to Pi 312, and Po 314. The pre-amplifying comparator PR 350, on the other hand, sets a reference input voltage into the second ADC 345. The pre-amplifying comparator PR 350 is used in this example, according to a preferred embodiment, to preferably track temperature variation, power supply variation, and manufacturing process variation, relative to the other pre-amplifying comparators Pn 308, Pi+1 310 to Pi 312, and Po 314. However, according to an alternative embodiment, the pre-amplifying comparator PR 350 could be replaced with passive circuit components, or another voltage reference circuit, to supply a reference input voltage to the second ADC 345.

Figure 4:
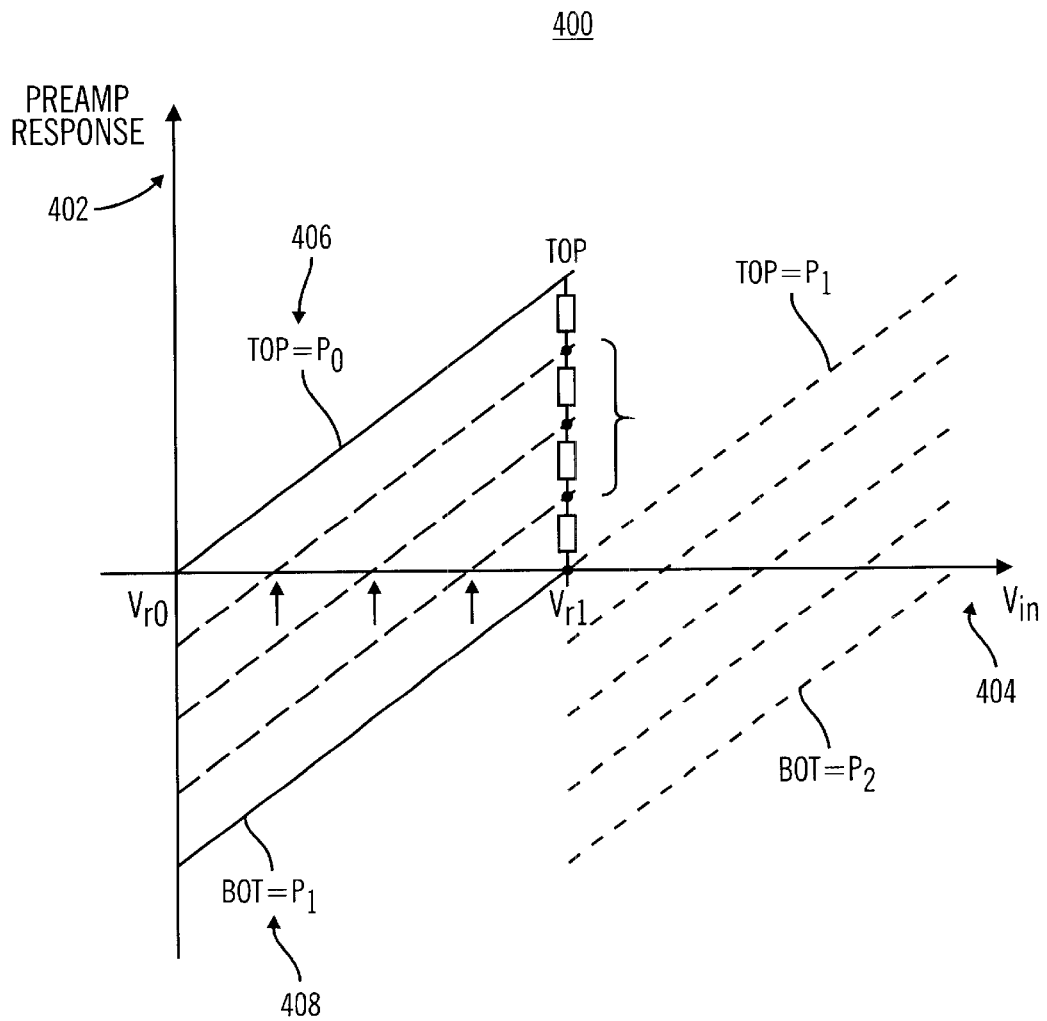
FIG. 4 is a graph illustrating the relationship between input voltage and the voltages on the buses labeled TOP and BOT in the electrical circuit block diagram shown in FIG. 3.

The second ADC compares the output voltages, indicated by the vertical axis 402 in FIG. 4, i.e., the two reference voltages that are provided at TOP and BOT outputs 346, 348, corresponding to the two pre-amps that bracket the input voltage, indicated by the horizontal axis 404 in FIG. 4, and the interpolation between them. In FIG. 4 one can see an example of how this works in that the two lines called TOP 406 and BOT 408 typically should be ideally exactly linear with Vin on the horizontal axis 404. The dashed diagonal lines between TOP and BOT lines 406, 408, are the voltages along the interpolation string and where the lines cross the zero axis is where the second ADC 345 makes its decisions. Accordingly, that's why typically a reference voltage input to that second ADC 345 would be set to a zero input voltage. According to this example, the second ADC 345 would be arranged in a single ended design with a single reference input voltage 352 that is normally set to zero voltage. Generally, an ADC design keeps a reference ladder fixed for an ADC and varies input voltage to make decisions. In the ADC 300 system, according to a preferred embodiment of the present invention, the input voltage 352 remains fixed and the interpolation is performed between moving pre-amp outputs, i.e., the two reference voltages that are provided at TOP and BOT outputs 346, 348, in the ADC 300.

The second ADC 345, in this example, comprises three comparators which compare the interpolated voltages along the dashed lines corresponding to the fixed input voltage and where the dashed lines cross the horizontal axis is where the second ADC 345 makes its decision because the comparators in the second ADC 345 look at Vin 404 at those three interpolated voltages, as shown in FIG. 4. The diagram also shows how Vin 404 coming from zero and going to the right is compared to varying ranges of reference voltages TOP and BOT, 406, 408. The first set of TOP and BOT reference voltages, 406, 408, start at zero input voltage and end at Vr1 because at the point that the BOT voltage 408 crosses the zero axis is where the next higher pre-amp pair switches state at the course ADC 301. Then as shown to the right of Vr1, in FIG. 4, the dashed lines indicating the TOP and BOT and the interpolation voltage range repeat themselves again at the next higher pre-amp pair of the course ADC 301. The three comparators inside the fine ADC 345 compare between the fixed reference voltage at input Vin 352 and varying reference voltages interpolated between the rails TOP and BOT 346, 348. The fine ADC 345 samples the comparison of the interpolated signal to provide a digital representation signal corresponding to the least significant bits of a digital representation of the input voltage at the input 302. The least significant bits output 356 from the fine ADC 345 indicate a small change in voltage, which is the smallest step that the overall ADC 300 can resolve, while the most significant bits output 344 indicate the larger, i.e., coarse, voltage step corresponding to the TOP and BOT reference voltage range 346, 348, of the input voltage at the input 302.

Figure 5:
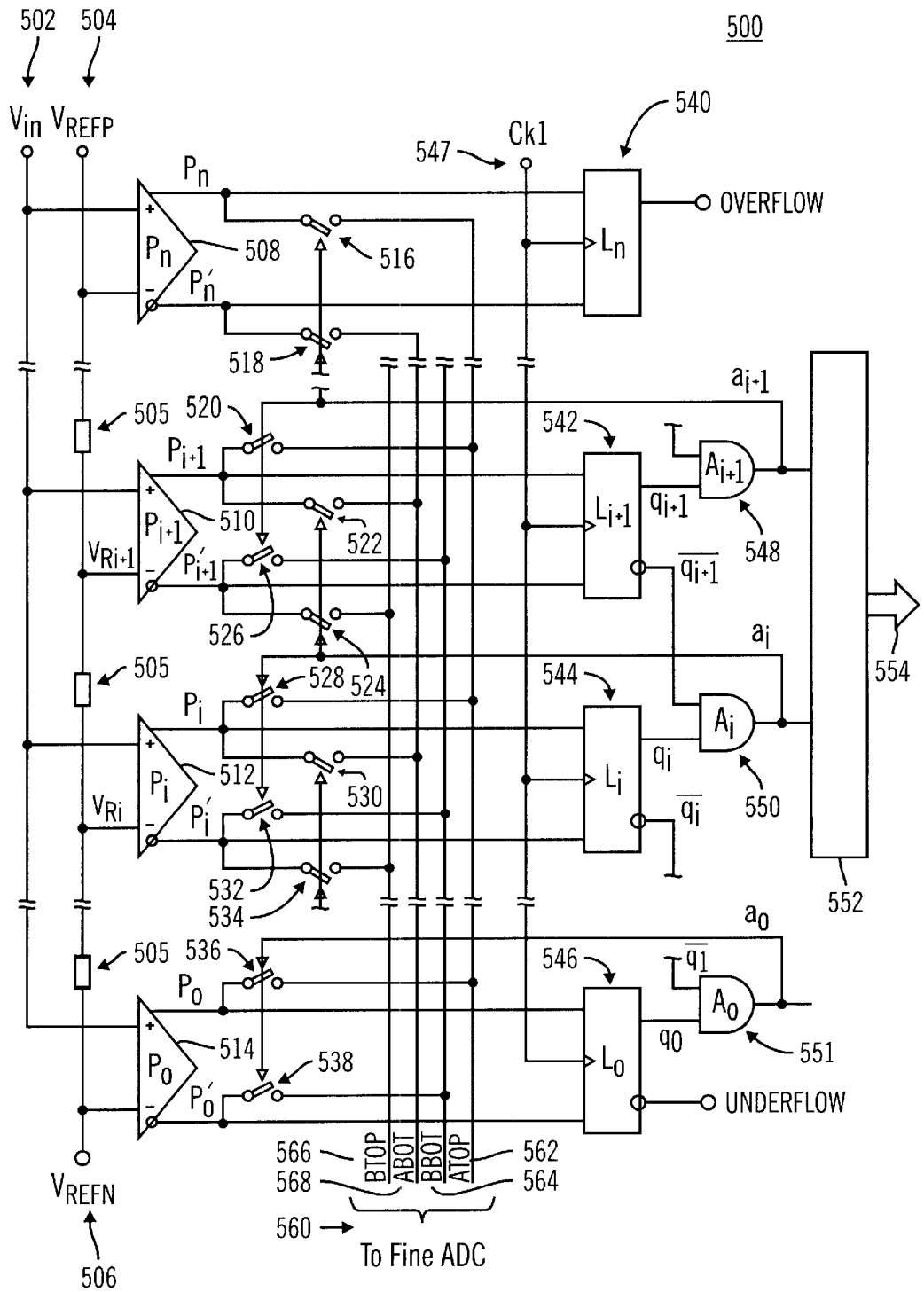
FIGS. 5 and 6 constitute an electrical circuit block diagram showing an exemplary analog-to-digital converter comprising a differential amplifier circuit topology, in accordance with a preferred embodiment of the present invention.

An alternative embodiment for an ADC 500 according to the present invention is shown in FIG. 5 advantageously utilizing a differential circuit arrangement. A differential ADC system utilizes two output lines coming out of a pre-amp circuit 508, 510, 512, 514, such as shown. This makes the ADC 500 much more repeatable and resistant to noise. Noise signals are a major source of problems for analog to digital converters and such noise sources tend to degrade the performance of ADCs. Accordingly, the embodiment of the present in invention being discussed with reference to FIG. 5 adds significant value to users of the ADC 500.

A preferred embodiment of the present invention, therefore, comprises the differential system, where the pre-amps 508, 510, 512, 514, each have two complementary outputs—one goes up in output voltage and the other goes down in output voltage. These complementary outputs are also known as differential output signals. Each differential output signal comprises a pair of the complementary outputs, where one goes up in output voltage and the other goes down in output voltage. The advantages of a differential system vs. a single ended system include improved manufacturability and reduced susceptibility to picking up noise signals. ADCs are always sensitive to noise because often a design wants to resolve millivolts of an input voltage while an ADC would drive digital outputs (typically 5 volts) on an integrated circuit chip and communicate with the rest of a digital circuit such as a video processor. If a sensitive ADC shares a chip with a video processor normally there are a few hundred thousand digital gates on the chip and the ADC can easily pick up noise through the substrate of the chip. The noise in the substrate of the chip is normally in common mode because it's a large area phenomenon such as over ground planes. The differential architecture of the preferred embodiment of the present invention is very effective at reducing sensitivity to such noise signals. This differential architecture does utilize more basic circuitry, such as twice the number of switches to switch the pre-amp output voltage lines. However, the standard circuitry is cost effective to manufacture in an ADC and the small incremental cost per unit is significantly outweighed by the substantial reduction in noise sensitivity allowing a differential ADC, according to the present invention, to be more reliably and cost effectively manufactured and used. Note that in the past any ADC circuits that, for example due to manufacturing variability, were manufactured with a high sensitivity to noise signals would not be repairable and would have to be wasted. Utilizing the present invention, an ADC would be substantially resistant to the noise signals and the symmetry of the differential architecture would enhance the overall manufacturability of devices. Hence, more ADC devices could be manufactured for hash noise environments such as for locating in close proximity to video processors and high speed logic circuits.

Figure 6:
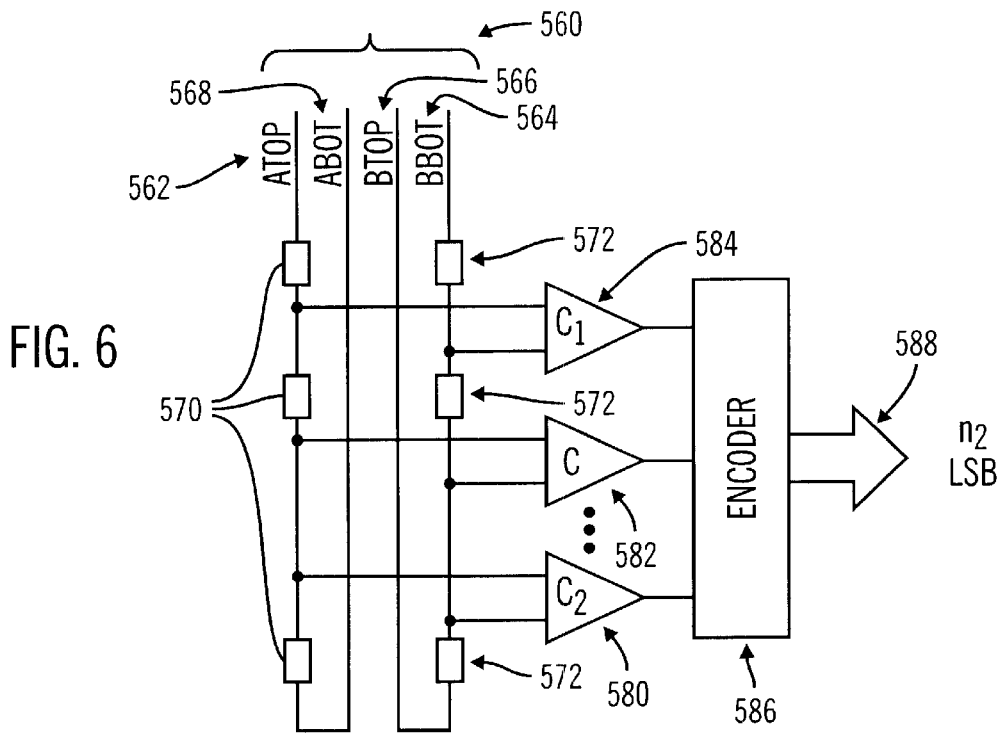

Referring to FIGS. 5 and 6, the differential outputs, 562, 564, 566, 568, from the pre-amps 508, 510, 512, 514, are electrically coupled to the differential inputs of comparator preamps 580, 582, 584, for the second ADC (shown in FIG. 6) that is also arranged in a differential circuit architecture. Instead of utilizing a fixed single ended input and interpolated reference voltages TOP and BOT, as discussed above with reference to FIG. 3, the differential ADC 500 shown in FIGS. 5 and 6 comprises two pairs of interpolating reference voltages that move against each other, i.e., one moves up in voltage and the other moves down in voltage. Each pair of reference voltages bound a voltage of the input voltage signal at the input 502. The latches 540, 542, 544, 546, and the AND gates 548, 550, 551, and the clock input 547, operate to capture a thermometer type output similar to the discussion above with reference to FIG. 3. This output is received by input to an encoder 552 that provides most significant bits 554 of a digital representation of a voltage signal at the input 502.

The comparator preamps 580, 582, 584, of the second ADC (see FIG. 6) are electrically coupled between opposing ends of the two resistive ladders 570, 572, in a differential circuit arrangement. For example, the first comparator 584 is attached through one resistor each to line A TOP 562 and to line B BOT 564. The second comparator 582 is electrically coupled to the middles of both ladders 570, 572. The third comparator 580 is electrically coupled through one resistor to the bottom end of the A TOP line 562, which is also A BOT 568. The comparator 580 is also electrically coupled through one resistor to the bottom of B BOT line 564, that is also B TOP 566. This arrangement constitutes a fine ADC structure with interpolation and comparators of a fine ADC sampling an interpolated signal corresponding to at least a pair of reference voltages. The second encoder 586 provides the least significant bits 588, while a first encoder 552 provides the most significant bits 554, of a digital representation of an input voltage signal at the input 502.

Typically an ADC would utilize one single input voltage and then compare the input voltage relative to a set of reference voltages. According to a preferred embodiment of the present invention, as illustrated in FIG. 6, a preferred embodiment of an ADC 500 utilizes two sets of references with lines crossing each other. Instead of having one set of interpolating lines crossing a fixed reference voltage, such as a zero voltage at the horizontal axis 404, as was discussed with reference to FIG. 4, now with reference to FIG. 7 there are two sets of interpolated voltages that cross each other. The lines cross each other at the main horizontal axis 704. But, this horizontal axis 704 does not have to be an absolutely fixed voltage reference any more. One advantage is that the ADC 500 has totally removed the absolute reference voltages and has enhanced reproducibility of ADC devices in terms of noise pick up. This is a significant advantage of the present invention.

Now the first ADC comprises two pairs of reference voltages coming out of the pre-amps 508, 510, 512, 514. These two pairs of reference voltages are electrically coupled to the second ADC as shown in FIG. 6. Instead of two lines, as was electrically coupled to the second ADC 345 shown in FIG. 3, now there are four lines 562, 564, 566, 568, electrically coupled as shown in FIGS. 5 and 6. The ADC 500 does not need a fixed reference voltage. So, for example, the second ADC (shown in FIG. 6) does not need a dummy pre-amp, such as the pre-amp 350 shown in FIG. 3, anymore in the differential approach illustrated in FIGS. 5 and 6.

As shown in FIGS. 5 and 6, there are two interpolation ladders 570, 572. There's an A ladder 570, and a B ladder 572. A TOP 562 goes through a resistor ladder 570 to A BOT 568, and B TOP 566 goes through a resistor ladder 572 to B BOT 564.

Advantages of the differential architecture, in accordance with the preferred embodiments of the present invention, include the following. First of all, products including the novel ADC 500 are more manufacturable. Second, these products will be less susceptible to picking up noise. The differential ADC design, according to a preferred embodiment of the present invention, avoids picking up common mode noise that is problematic for many other conventional ADC designs. In ADCs noise pickup is a critical concern because normally there is a sensitive input stage. Typically the ADC input stage attempts to resolve milivolts of input voltage and then the ADC output stage has to drive outputs to standard logic levels for video processors, such as 5 volts or higher. If the ADC shares an integrated circuit chip with a video processor, as is commonly necessary in modern systems due to miniaturization constraints imposed by customers, then the noise coupling is worse because then several hundred thousand digital gates are located in close proximity on the same chip coupling noise via the common substrate to the ADC circuits. This noise is common mode because it is a large area phenomena. So, to resist such noise interfering with the normal operation of the ADC, a differential ADC architecture according to the present invention is a superior alternative over ADCs in the past.

Although according to a preferred embodiment of the present invention, the ADC 500 utilizes twice the number of switches to switch the pre-amp 508, 510, 512, 514, to the output lines 562, 564, 566, 568, this added cost is significantly outweighed by the more reliable and manufacturable products. This invention saves significant costs in manufacturing, testing, and field service of devices that include the novel ADC design.

The differential outputs 562, 564, 566, 568, from the pre-amps 508, 510, 512, 514, facilitates also having differential input comparators 580, 582, 584, in the second ADC circuits that can also be fully differential. Instead of having a fixed input voltage and interpolated references, as discussed with respect to FIG. 3, now the preferred alternative ADC 500 comprises two sets of interpolated references that move against each other, i.e., one moves up in voltage and the other moves down in voltage. The input comparators 580, 582, 584, are tied between opposing ends of the two resistive ladders 570, 572. For example, a first comparator 584 is electrically coupled to B BOT 564 and then to A TOP 562. A second comparator 582 is electrically coupled to A TOP 562 and to B BOT 564. A third comparator 580 is coupled to the end of B BOT 564, that is next to B TOP 566, and is also coupled to the end of A TOP 562, that is next to A BOT 568. This is a preferred implementation of a fine ADC input structure providing the interpolation and the comparators of a fine ADC.

Figure 7:
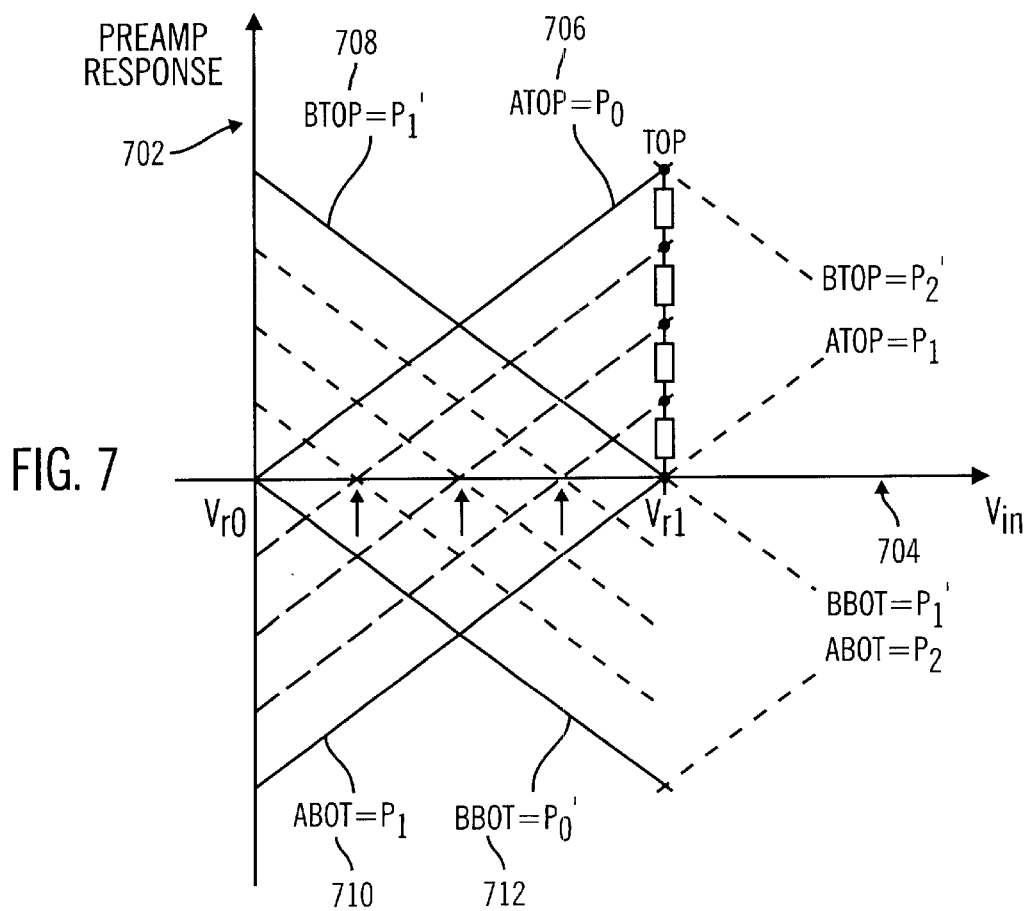
FIG. 7 is a graph illustrating the relationship between input voltage and the voltages on the buses labeled ATOP, ABOT, BTOP, and BBOT, in the electrical circuit block diagram shown in FIGS. 5 and 6.

This new and novel input structure for an ADC provides significant advantages not available in any known prior art ADC system. Typically, in the past, an ADC consisted of a single input coupled to a single input voltage and the other inputs connected to a set of reference voltages. Here, on the other hand, there are two sets of reference voltages that slide past each other. And where these sets of reference voltages cross, as shown in FIG. 7, instead of having one set of interpolated lines crossing a fixed voltage reference at the axis, now there are two sets of interpolated voltages that cross each other. Note also that although in this example the sets of voltages, i.e., B TOP 708 to B BOT 712 and A TOP 706 to A BOT 710, cross about the main axis 704, it is not a requirement that this voltage be set to a zero voltage or to any particular fixed voltage. The cross-over point can be set at other than at the zero reference point. This novel structure totally removes any dependency on an absolute reference voltage. Additionally, the voltage crossings between the two sets of voltages (in the differential architecture) provides a steeper voltage crossing that makes it easier and less noisy to make a decision at the crossing points. This additionally makes the novel ADC circuit much more reproducible and much less sensitive to noise pickup. This differential ADC embodiment is consequently much preferred over a single ended ADC design.

As discussed above, the four lines 560, namely A TOP 562, B BOT 564, B TOP 566, and A BOT 568, route from FIG. 5 to FIG. 6 where they constitute inputs to the fine ADC circuit. The four lines 560 are the differential outputs of the two relevant preamps 508, 510, 512, 514, that detect the coarse reference voltage boundaries (in steps as set by the resistive ladder 505 and the reference voltage inputs 504, 506) of an input voltage, at input 502, for the overall differential ADC 500. A significant advantage is that a fixed reference voltage is not needed in this design. A dummy pre-amp 350, such as used in FIG. 3, is likewise not necessary in the advantageous design of FIGS. 5 and 6. There are two interpolation ladders labeled A and B.

Specifically, the switches 516, 516, 520, 522, 524, 528, 530, 532, 534, 536, 538, as shown in FIG. 5, illustrate an exemplary arrangement for selecting the two sets of reference voltages that are electrically coupled to the fine ADC circuit in the overall differential ADC 500. For example, if Pi and Pi+1 set the boundaries of reference voltage for an input voltage signal, pre-amp Pi 512 gets switched to A TOP 562 and B BOT 564, and at the same time, the pre-amp Pi+1 would be switched to B TOP 566 and A BOT 568. Note that if an AND gate output is high then the controlled switches get turned ON, otherwise the switches are normally OFF.

Figure 8:
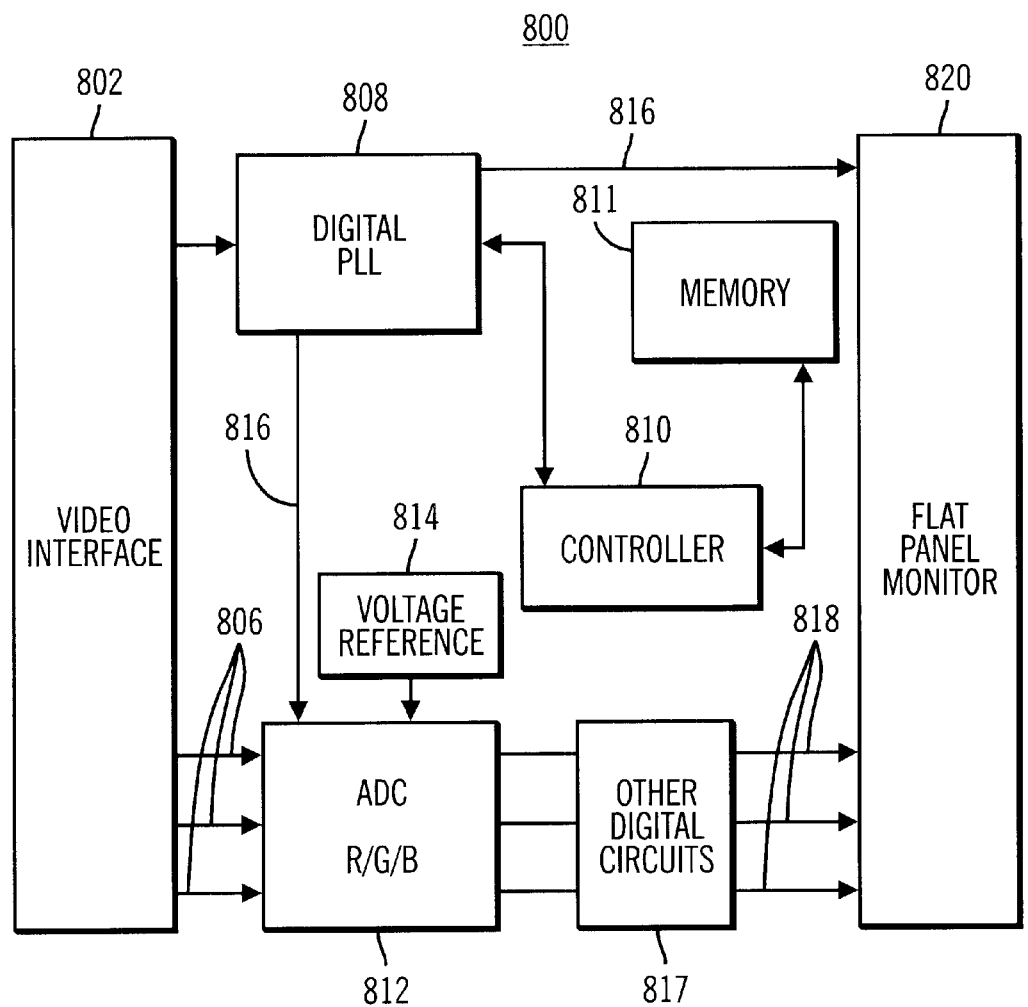
FIG. 8 is a functional block diagram of an exemplary video signaling system utilizing a high speed video analog-to-digital converter, in accordance with a preferred embodiment of the present invention.

Referring to FIG. 8, an exemplary application of a preferred embodiment of the present invention operates in a flat panel display monitor system 800. A graphics card inside a PC typically contains a graphics accelerator IC and a frame buffer. The graphics accelerator renders a frame of data in memory then converts to analog and transmits to an LCD monitor via an analog VGA cable. In addition to the analog data, horizontal and vertical synchronization signals are transmitted. This video signal is delivered via the cable to a video interface 802 of a flat panel monitor system 800 that includes a preferred embodiment of the present invention, as will be discussed below.

Flat panel monitors based on liquid crystal display (LCD) technology are rapidly deploying into the personal computer display marketplace. Flat panel monitors offer performance advantages over conventional CRT monitors, but the PC industry faces challenges in seamlessly integrating them into the desktop PC environment. In addition to size, weight and power advantages flat panel monitors improve image acuity. Flat panel monitors are digital devices, and have the benefits of digital technology in the panel electronics, compared to analog CRT technology. Each pixel element in a flat panel monitor is micro-lithographically defined, which results in precisely defined pixel areas, unlike the fuzzy overlap of phosphor dots and the electron beams in a CRT.

Most LCD modules used in flat panel monitor applications require digital interfaces. These digital interfaces create difficulties in connecting to the analog graphics output of today's personal computers. Expensive and complex analog circuit boards have been used to convert the analog signals from the PC into the digital signals required by the flat panel. In the past, users have been unable to realize all of the image quality benefits of flat panel monitors because these boards have not been able to perfectly reproduce the digital source data, as it existed in the PC. These interface challenges and user expectations set the flat panel monitor electronics requirement. Compatibility with the PC environment first starts by properly reconstructing the clock, as described in co-pending U.S. patent application Ser. No. 09/534,932, entitled "Digital Phase Lock Loop", and co-pending U.S. patent application Ser. No. 09/535,049, entitled "System for High Precision Signal Phase Difference Measurement", both identified U.S. Patent Applications being commonly owned by the assignee of the present invention, and the full teachings of both identified U.S. Patent Applications being hereby incorporated by reference. Then, compatibility is achieved by successfully converting the analog data from the PC video signal into a digital format in the flat panel monitor, as will be discussed below.

The synchronization signals include a regenerate pixel clock signal 816. The new pixel clock 816 is used by the analog to digital converters (ADC) 812 to capture the analog input data signal in digital form. The analog to digital converters 812, as discussed with reference to FIG. 8, comprise the advantageous inventive concepts discussed above with respect to the ADC 500 (shown in FIGS. 5 and 6) and with respect to the ADC 300 (shown in FIG. 3). The ADC 812 preferably include the advantageous differential architecture and other significant advantages of the present invention, as discussed above. The digital signal reconstruction process consists of three steps. Sync and video timing information in the video signal present at the video interface 802 is used to determine the video mode of the graphics card driving the analog cable. The mode detection circuit then programs the clock recovery circuit, the digital phase lock loop (DPLL) 808, to regenerate the pixel clock signal 816. Finally, the regenerated pixel clock is provided at an output 816 of the DPLL 808. This pixel clock 816 drives the flat panel monitor 820. The clock output 816 also drives the sampling clock input of the analog to digital converters (ADC) 812 which transform the input analog red, green, and blue (RGB) video signals to digital form at outputs of the ADC 812. After being processed through other digital circuits 817 the (RGB) digital video signals, at output lines 818, are electrically coupled to the flat panel monitor 820.

In the first step inside the LCD monitor, the analog subsystem, including the DPLL 808 under control of the controller 810 operating from instructions stored in memory 811, attempts to detect the video mode of the graphics IC providing the video signal out of the PC. Based on the detected mode, the digital phase lock loop 808 is programmed to generate a certain number of pixel clocks per horizontal sync. The analog to digital converters (ADC) 812 then produce digital outputs, using this reconstructed sampling clock signal 816.

According to a preferred embodiment of the present invention, the ADC 812 and the DPLL 808, the controller 810, and the memory 811, can all be located in one ASIC chip. Alternatively, the ADC 812 could be external and the controller 810 and memory 811 could be located internal to an ASIC chip. In a further alternative, the entire circuit can comprise electrically coupled circuit components that are not located in any particular ASIC chip.

As described in detail in U.S. patent application Ser. No. 09/534,932 and in U.S. patent application Ser. No. 09/535,049, the DPLL 808 includes a controllable digital frequency synthesizer. The controller 810 can couple a thirty two bit number to the DPLL 808 to generate a high precision frequency signal at the clock output 816. This digital frequency synthesizer sub-system, according to a preferred embodiment of the present invention, takes a 32 bit fixed precision number and generates a 50% duty cycle clock at a precise frequency for driving the ADC 812.

The present invention offers significant advantages over the prior art. In prior art systems, conventional ADCs were adequate for slower signal sampling rates. However, with new high speed digital signaling requirements, such as for video signaling systems, it requires a new and novel ADC 300, 500, according to the present invention, which provides the necessary new circuit features and functions to process the high speed signals as discussed above. The new and novel ADC 300, 500, as discussed above, provides significantly improved high speed performance for devices incorporating the present invention while increasing the quality and reducing the overall costs of manufacturing such devices.

Although specific embodiments of the invention have been disclosed, those having ordinary skill in the art will understand that changes can be made to the specific embodiments without departing from the spirit and scope of the invention. Additionally, many modifications may be made to adapt a particular situation to the teachings of the present invention without departing from the central inventive concepts described herein. Furthermore, an embodiment of the present invention may not include all of the features described above. The scope of the invention is not to be restricted, therefore, to the specific embodiments, and it is intended that the appended claims cover any and all such applications, modifications, and embodiments within the scope of the present invention.

What is claimed is:

1. An electronic signal sampling circuit comprising:
   a first input for receiving an electronic signal;
   a sampling clock input for receiving a sampling clock signal;
   a first sampling circuit, electrically coupled to the first input and to the sampling clock input and responsive to the sampling clock signal, for sampling the electronic signal to determine a first pair of boundary reference voltage signals that bound the voltage of the sampled electronic signal, and further to convert the sampled electronic signal to provide a first digital representation thereof at times indicated by the sampling clock signal; and
   a second sampling circuit, electrically coupled to the first sampling circuit, for sampling an interpolated signal, that is different than the electronic signal, and corresponding to the first pair of boundary reference voltage signals that bound the voltage of the sampled electronic signal, and further to convert the sampled interpolated signal to provide a second digital representation of the sampled electronic signal at times indicated by the sampling clock signal, the first digital representation and the second digital representation being provided as output of the electronic signal sampling circuit.

2. The electronic signal sampling circuit of claim 1, wherein the first digital representation constitutes the most significant bits of a third digital representation of the sampled electronic signal and the second digital representation constitutes the least significant bits of the third digital representation of the sampled electronic signal, the third digital representation being provided as the output of the electronic signal sampling circuit.

3. The electronic signal sampling circuit of claim 1, wherein the first sampling circuit comprises at least one comparator pre-amplifier in a differential output arrangement and electrically coupled to the first input, for sampling the electronic signal to determine the first pair of boundary reference voltage signals and to provide a differential output signal representing the first pair of boundary reference voltage signals.

4. The electronic signal sampling circuit of claim 3, wherein the second sampling circuit comprises at least one comparator pre-amplifier electrically coupled to the first sampling circuit in a differential circuit arrangement, for sampling the interpolated signal corresponding to the first pair of boundary reference voltage signals that bound the voltage of the sampled electronic signal.

5. The electronic signal sampling circuit of claim 1, wherein the first and second sampling circuits are arranged in differential circuit arrangement.

6. The electronic signal sampling circuit of claim 1, wherein the second sampling circuit includes at least one interpolation ladder, and wherein the first pair of boundary reference voltages are electrically coupled to the at least one interpolation ladder for the second sampling circuit to sample the interpolated signal corresponding to the first pair of boundary reference voltage signals that bound the voltage of the sampled electronic signal, and further for the second sampling circuit to convert the sampled interpolated signal to provide the second digital representation of the sampled electronic signal.

7. The electronic signal sampling circuit of claim 1, wherein the second sampling circuit comprises a fixed input voltage signal while the first sampling circuit varies the voltage of the first pair of boundary reference voltage signals to bound the voltage of the sampled electronic signal, the second sampling circuit sampling the interpolated signal by comparing the fixed input voltage signal to the interpolated signal corresponding to the first pair of boundary reference voltage signals that bound the voltage of the sampled electronic signal.

8. An electronic signal sampling circuit comprising:
   a first input for receiving an electronic signal;
   a sampling clock input for receiving a sampling clock signal;
   a first sampling circuit, electrically coupled to the first input and to the sampling clock input and responsive to the sampling clock signal, for sampling the electronic signal to determine a first pair of boundary reference voltage signals that bound the voltage of the sampled electronic signal, and further to convert the sampled electronic signal to provide a first digital representation thereof at times indicated by the sampling clock signal; and
   a second sampling circuit, electrically coupled to the first sampling circuit, for sampling an interpolated signal corresponding to the first pair of boundary reference voltage signals that bound the voltage of the sampled electronic signal, and further to convert the sampled interpolated signal to provide a second digital representation of the sampled electronic signal at times indicated by the sampling clock signal, the first digital representation and the second digital representation being provided as output of the electronic signal sampling circuit, and wherein the first sampling circuit is arranged in a differential output circuit arrangement to provide two pairs of output voltage signals that represent the first pair of boundary reference voltage signals that bound the voltage of the sampled electronic signal.

9. The electronic signal sampling circuit of claim 8, wherein the second sampling circuit comprises a plurality of comparators that are electrically coupled to the differential output circuit arrangement of the first sampling circuit to sample the interpolated signal corresponding to the first pair of boundary reference voltage signals that bound the voltage of the sampled electronic signal.

10. An analog-to-digital converter comprising:
    a first input for receiving an electronic signal;
    a sampling clock input for receiving a sampling clock signal;
    a first sampling circuit, electrically coupled to the first input and to the sampling clock input and responsive to the sampling clock signal, for sampling the electronic signal to provide at least a pair of boundary reference voltage signals that bound the voltage of the sampled electronic signal, and further to provide most significant bits of a digital representation of the electronic signal at occurrences corresponding to the sampling clock signal; and
    a second sampling circuit, electrically coupled to the first sampling circuit, for sampling a voltage signal, that is different than the electronic signal, and corresponding to the at least a pair of boundary reference voltage signals that bound the voltage of the sampled electronic signal, and further to provide least significant bits of the digital representation of the electronic signal at occurrences corresponding to the sampling clock signal.

11. The analog-to-digital converter of claim 10, wherein the second sampling circuit comprises an interpolation circuit electrically coupled to the first sampling circuit to provide an interpolated voltage signal corresponding to the at least a pair of boundary reference voltage signals that bound the voltage of the sampled electronic signal, the second sampling circuit sampling the interpolated voltage signal to provide the least a significant bits of the digital representation of the electronic signal.

12. The analog-to-digital converter of claim 10, wherein the first sampling circuit comprises at least one comparator pre-amplifier in a differential output arrangement and electrically coupled to the first input, for sampling the electronic signal to provide a differential output signal representing the at least a pair of boundary reference voltage signals that bound the voltage of the sampled electronic signal.

13. The analog-to-digital converter of claim 12, wherein the second sampling circuit comprises an interpolation circuit electrically coupled to the differential output arrangement of the at least one comparator pre-amplifier of the first sampling circuit to provide an interpolated voltage signal corresponding to the at least a pair of boundary reference voltage signals that bound the voltage of the sampled electronic signal, the second sampling circuit sampling the interpolated voltage signal to provide the least significant bits of the digital representation of the electronic signal.

14. The analog-to-digital converter of claim 10, wherein the second sampling circuit comprises a fixed input voltage signal while the first sampling circuit varies the voltage of the at least a pair of boundary reference voltage signals to bound the voltage of the sampled electronic signal, the second sampling circuit sampling the voltage signal by comparing the fixed input voltage signal to the voltage signal corresponding to the at least a pair of boundary reference voltage signals that bound the voltage of the sampled electronic signal.

15. The analog-to-digital converter of claim 10, wherein the second sampling circuit includes at least one interpolation ladder, and wherein the at least a pair of boundary reference voltage signals are electrically coupled to the at least one interpolation ladder for the second sampling circuit to sample an interpolated signal corresponding to the at least a pair of boundary reference voltage signals that bound the voltage of the sampled electronic signal.

16. The analog-to-digital converter of claim 15, wherein the second sampling circuit converts the sampled interpolated signal to provide the least significant bits of the digital representation of the electronic signal.

17. An analog-to-digital converter comprising:
a first input for receiving an electronic signal;
a sampling clock input for receiving a sampling clock signal;
a first sampling circuit, electrically coupled to the first input and to the sampling clock input and responsive to the sampling clock signal, for sampling the electronic signal to provide at least a pair of boundary reference voltage signals that bound the voltage of the sampled electronic signal, and further to provide most significant bits of a digital representation of the electronic signal at occurrences corresponding to the sampling clock signal; and a second sampling circuit, electrically coupled to the first sampling circuit, for sampling a voltage signal corresponding to the at least a pair of boundary reference voltage signals that bound the voltage of the sampled electronic signal, and further to provide least significant bits of the digital representation of the electronic signal at occurrences corresponding to the sampling clock signal, and wherein the first sampling circuit is arranged in a differential output circuit arrangement to provide two pairs of output voltage signals that represent a pair of boundary reference voltage signals that bound the voltage of the sampled electronic signal.

18. The analog-to-digital converter of claim 17, wherein the second sampling circuit comprises a plurality of comparators arranged in a differential circuit arrangement and that are electrically coupled to the differential output circuit arrangement of the first sampling circuit to sample the voltage signal corresponding to the two pairs of output voltage signals that represent the pair of boundary reference voltage signals.

19. The analog-to-digital converter of claim 18, wherein the second sampling circuit comprises an interpolation circuit electrically coupled to the differential output circuit arrangement of the first sampling circuit, and wherein the plurality of comparators arranged in a differential circuit arrangement is electrically coupled to interpolation circuit for sampling an interpolated signal, the second sampling circuit sampling the interpolated voltage signal to provide the least significant bits of the digital representation of the electronic signal.

20. A video display monitor system comprising:
a video display monitor;
a video interface for providing an electronic signal;
a clock source for providing a sampling clock signal; and
an analog-to-digital converter, electrically coupled to the video interface for receiving the electronic signal therefrom, electrically coupled to the clock source for receiving the sampling clock signal, and electrically coupled to the video display monitor for providing thereto digital representations of samples of the electronic signal, the analog-to-digital converter comprising:
a first input for receiving the electronic signal;
a sampling clock input for receiving the sampling clock signal;
a first sampling circuit, electrically coupled to the first input and to the sampling clock input and responsive to the sampling clock signal, for sampling the electronic signal to provide at least a pair of boundary reference voltage signals that bound the voltage of the sampled electronic signal, and further to provide most significant bits of a digital representation of the electronic signal at occurrences corresponding to the sampling clock signal; and
a second sampling circuit, electrically coupled to the first sampling circuit, for sampling a voltage signal, that is different than the electronic signal, and corresponding to the at least a pair of boundary reference voltage signals that bound the voltage of the sampled electronic signal, and further to provide least significant bits of the digital representation of the electronic signal at occurrences corresponding to the sampling clock signal.

21. The video display monitor system as defined in claim 20, wherein the second sampling circuit comprises an interpolation circuit electrically coupled to the first sampling circuit to provide an interpolated voltage signal corresponding to the at least a pair of boundary reference voltage signals that bound the voltage of the sampled electronic signal, the second sampling circuit sampling the interpolated voltage signal to provide the least significant bits of the digital representation of the electronic signal.

22. The video display monitor system as defined in claim 20, wherein the first sampling circuit comprises at least one comparator pre-amplifier in a differential output arrangement and electrically coupled to the first input, for sampling the electronic signal to provide a differential output signal representing the at least a pair of boundary reference voltage signals that bound the voltage of the sampled electronic signal.

23. The video display monitor system as defined in claim 22, wherein the second sampling circuit comprises an interpolation circuit electrically coupled to the differential output arrangement of the at least one comparator pre-amplifier of the first sampling circuit to provide an interpolated voltage signal corresponding to the at least a pair of boundary reference voltage signals that bound the voltage of the sampled electronic signal, the second sampling circuit sampling the interpolated voltage signal to provide the least significant bits of the digital representation of the electronic signal.

24. The video display monitor system as defined in claim 20, wherein the second sampling circuit comprises a fixed input voltage signal while the first sampling circuit varies the voltage of the at least a pair of boundary reference voltage signals to bound the voltage of the sampled electronic signal, the second sampling circuit sampling the voltage signal by comparing the fixed input voltage signal to the voltage signal corresponding to the at least a pair of boundary reference voltage signals that bound the voltage of the sampled electronic signal.

25. The video display monitor system as defined in claim 20, wherein the second sampling circuit includes at least one interpolation ladder, and wherein the at least a pair of boundary reference voltage signals are electrically coupled to the at least one interpolation ladder for the second sampling circuit to sample an interpolated signal corresponding to the at least a pair of boundary reference voltage signals that bound the voltage of the sampled electronic signal.

26. The video display monitor system as defined in claim 25, wherein the second sampling circuit converts the sampled interpolated signal to provide the least significant bits of the digital representation of the electronic signal.

27. The video display monitor system as defined in claim 20, wherein the first sampling circuit is arranged in a differential output circuit arrangement to provide two pairs of output voltage signals that represent a pair of boundary reference voltage signals that bound the voltage of the sampled electronic signal.

28. The video display monitor system as defined in claim 27, wherein the second sampling circuit comprises a plurality of comparators arranged in a differential circuit arrangement and that are electrically coupled to the differential output circuit arrangement of the first sampling circuit to sample the voltage signal corresponding to the two pairs of output voltage signals that represent the pair of boundary reference voltage signals.

29. The video display monitor system as defined in claim 28, wherein the second sampling circuit comprises an interpolation circuit electrically coupled to the differential output circuit arrangement of the first sampling circuit, and wherein the plurality of comparators arranged in a differential circuit arrangement is electrically coupled to interpolation circuit for sampling an interpolated signal, the second sampling circuit sampling the interpolated voltage signal to provide the least significant bits of the digital representation of the electronic signal.

* * * * *